(12) United States Patent
Konno

(10) Patent No.: US 8,389,324 B2
(45) Date of Patent: Mar. 5, 2013

(54) METHOD OF MANUFACTURING SOLAR CELL ELECTRODE AND CONDUCTIVE PASTE

(75) Inventor: Takuya Konno, Kanagawa (JP)

(73) Assignee: E I du Pont de Nemours and Company, Wilmington, DE (US)

(*) Notice: Subject to any disclaimer, the term of this patent is extended or adjusted under 35 U.S.C. 154(b) by 0 days.

(21) Appl. No.: 13/176,002

(22) Filed: Jul. 5, 2011

(65) Prior Publication Data
US 2013/0011959 A1     Jan. 10, 2013

(51) Int. Cl.
*H01L 21/00* (2006.01)
(52) U.S. Cl. ................... 438/98; 257/E21.159
(58) Field of Classification Search ............ None
See application file for complete search history.

(56) References Cited

U.S. PATENT DOCUMENTS
2009/0298283 A1   12/2009  Akimoto et al.
2010/0301479 A1*  12/2010  Yang et al. ............... 257/746

FOREIGN PATENT DOCUMENTS
JP   2010-135180   6/2010
JP   2010-199034   9/2010

* cited by examiner

*Primary Examiner* — Seahvosh Nikmanesh

(57) ABSTRACT

A method of manufacturing a solar cell electrode comprising steps of: applying onto a semiconductor substrate a conductive paste comprising (i) a conductive powder, (ii) a glass frit, (iii) an organic polymer and (iv) an organic solvent comprising 30 to 85 weight percent (wt %) of 1-phenoxy-2-propanol based on the weight of the organic solvent; and firing the conductive paste.

6 Claims, 2 Drawing Sheets

(a)

(b)

METHOD OF MANUFACTURING SOLAR CELL ELECTRODE AND CONDUCTIVE PASTE

FIELD OF THE INVENTION

The invention relates to a solar cell electrode, more specifically to a conductive paste to form a solar cell electrode and a method of manufacturing a solar cell electrode.

TECHNICAL BACKGROUND OF THE INVENTION

To manufacture a solar cell electrode with a conductive paste, the conductive paste is desired not to spread when applying it onto a substrate in order to obtain a desired pattern with high aspect ratio. A conductive paste would not spread when an added solvent is highly-volatile. However, on the other hand, a conductive paste is also required to be kept from drying during an electrode forming process for workability.

US20090298283 disclose a conductive paste comprising, a conductive powder, a glass frit, organic medium which comprises Bis(2-(2Butoxyethoxy)Ethyl)Adipate, dibasic ester, Octyl Epoxy Tallate, isotetradecanol, or pentaerythritol ester of hydrogenated rosin.

SUMMARY OF THE INVENTION

An objective is to provide a method of manufacturing a solar cell electrode with a conductive paste to form an electrode with high aspect ratio while keeping the paste from drying for workability.

An aspect relates to a method of manufacturing an electrode comprising steps of: applying onto a substrate a conductive paste comprising (i) a conductive powder, (ii) a glass frit, (iii) an organic polymer and (iv) an organic solvent comprising 30 to 85 weight percent (wt %) of 1-phenoxy-2-propanol based on the weight of the organic solvent; and firing the conductive paste.

Another aspect relates to a conductive paste comprising: (i) a conductive powder, (ii) a glass frit, (iii) an organic polymer and (iv) an organic solvent comprising 30 to 70 weight percent (wt %) of 1-phenoxy-2-propanol based on the weight of the organic solvent.

A quality of a solar cell electrode formed by the present invention can be improved.

DETAILED DESCRIPTION OF THE INVENTION

A method of manufacturing a solar cell electrode is explained below.
(Description of Method of Manufacturing an Electrode)

The following shows an embodiment of manufacturing process of a p-base silicon type solar cell. However, the invention is not limited to the following embodiment.

Figure 1A:
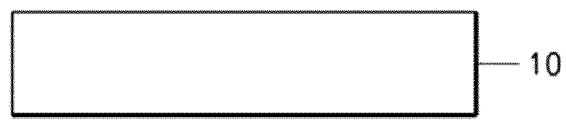
FIGS. 1A to 1F are drawings for explaining a solar cell electrode manufacturing process.
Figure 1B:
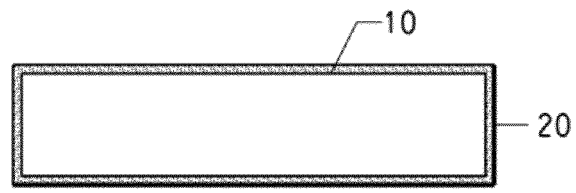

FIG. 1A shows a p-type silicon substrate 10. In FIG. 1B, an n-layer 20, of the reverse conductivity type is formed by the thermal diffusion of phosphorus (P) or the like. Phosphorus oxychloride ($POCl_3$) is commonly used as the phosphorus diffusion source. In the absence of any particular modification, n-layer 20 is formed over the entire surface of the silicon substrate 10. The silicon wafer consists of p-type substrate 10 and n-layer 20 typically has a sheet resistivity on the order of several tens of ohms per square (ohm/□).

Figure 1C:
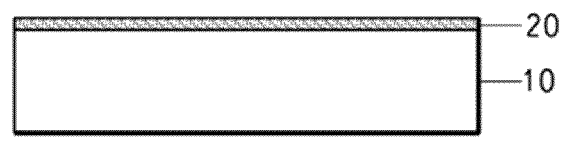

After protecting one surface of the n-layer with a resist or the like, the n-layer 20 is removed from most surfaces by etching so that it remains only on one main surface as shown in FIG. 1C. The resist is then removed using an organic solvent or the like.

Figure 1D:
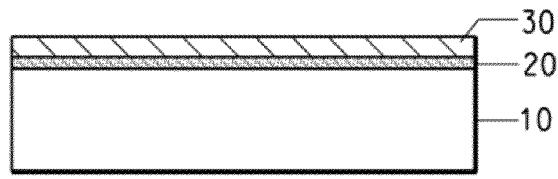

Next, a passivation layer 30 can be formed on the n-layer 20 as shown in FIG. 1D by a process such as plasma chemical vapor deposition (CVD). $SiN_x$, $TiO_2$, $Al_2O_3$, $SiO_x$ or ITO could be used as a material for a passivation layer. Most commonly used is $Si_3N_4$. The passivation layer is sometimes called anti-reflection layer, especially it is formed on the front side that is the light receiving side of the semiconductor substrate.

Figure 1E:
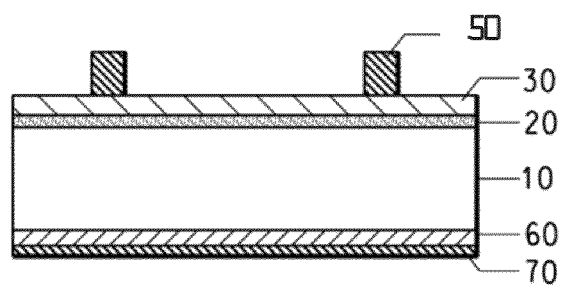

As shown in FIG. 1E, conductive paste, 50, for a front electrode is applied on the passivation layer, 30, formed on the silicon substrate then dried. An aluminum paste, 60, and a silver paste, 70, are screen printed onto the back side of the substrate, 10, and successively dried.

Firing is then carried out in an infrared furnace at a peak temperature in a range of 450° C. to 1000° C. Firing total time from an entrance to an exit of the furnace can be from 30 seconds to 5 minutes. With such firing condition, a semiconductor substrate can get less damage from the heat. In an embodiment of the present invention, firing profile can be 10 to 60 seconds at over 400° C. and 2 to 10 seconds at over 600° C.

Figure 1F:
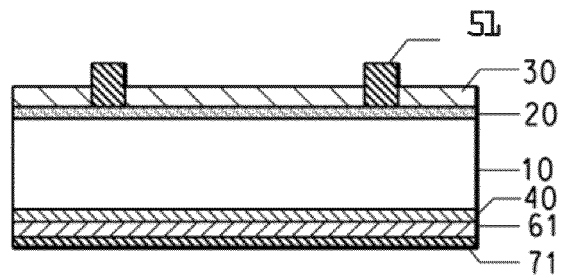

As shown in FIG. 1F, during firing, aluminum diffuses as an impurity from the aluminum paste into the silicon substrate, 10, on the back side, thereby forming a p+ layer, 40, containing a high aluminum dopant concentration. Firing converts the dried aluminum paste, 60, to an aluminum back electrode, 61. The backside silver paste, 70, is fired at the same time, becoming a silver back electrode, 71. During firing, the boundary between the backside aluminum and the backside silver assumes the state of an alloy, thereby achieving electrical connection. Most areas of the back electrode are occupied by the aluminum electrode, partly on account of the need to form a p+ layer, 40. At the same time, because soldering to an aluminum electrode is not easy, the silver paste, 70, is used to form a backside electrode, 71, on limited areas of the backside as an electrode for interconnecting solar cell cells by means of copper ribbon or the like.

On the front side, the front electrode, 51, is made of the conductive paste, 50, which is capable of fire through the passivation layer, 30, during firing to achieve electrical contact with the n-type layer, 20. The present invention can be used to form the front electrode, 51 that is required to be desired of fine width and high height.

Although a p-base type of solar cell is shown as an example, the invention can be used in a n-base type of solar cell, back contact type of solar cell, or any other type of solar cell using a conductive paste to form an solar cell electrode.

The invention can be used in an n-base silicon type of a solar cell, a back contact type of a solar cell, or any other type of a solar cell using a conductive paste to form a solar cell electrode, other than the p-base silicon type of a solar cell described above.

(Conductive Paste)

A conductive paste for manufacturing a solar cell electrode is explained in detail below. The conductive paste comprises (i) a conductive powder, (ii) a glass frit, (iii) an organic polymer and (iv) an organic solvent.

(i) Conductive Powder

A conductive powder is a metal powder to transport electrical current in an electrode.

In an embodiment, a conductive powder is a metal powder with an electrical conductivity $1.00 \times 10^7$ Siemens (S)/m or more at 293 Kelvin. Such conductive metals comprise, for example, iron (Fe; $1.00 \times 10^7$ S/m), aluminum (Al; $3.64 \times 10^7$ S/m), nickel (Ni; $1.45 \times 10^7$ S/m), copper (Cu; $5.81 \times 10^7$ S/m), silver (Ag; $6.17 \times 10^7$ S/m), gold (Au; $4.17 \times 10^7$ S/m), molybdenum (Mo; $2.10 \times 10^7$ S/m), magnesium (Mg; $2.30 \times 10^7$ S/m), tungsten ON; $1.82 \times 10^7$ S/m), cobalt (Co; $1.46 \times 10^7$ S/m) and zinc (Zn; $1.64 \times 10^7$ S/m).

In another embodiment, a conductive powder can be a metal powder with an electrical conductivity $3.00 \times 10^7$ S/m or more at 293 Kelvin. In this case, the conductive powder can comprise one or more metal powder(s) selected from the group consisting of Al, Cu, Ag and Au. In another embodiment, the conductive powder can comprise Ag powder, Al powder or a mixture thereof. In an embodiment, the conductive powder can comprise Ag powder. Using such conductive metal powders with high electrical conductivity, electrical property of an electrode could be improved.

In an embodiment, a conductive powder is flaky or spherical in shape.

There is no special restriction on particle diameter of the conductive powder from a viewpoint of technological effectiveness when used as typical electrically conducting paste. In an embodiment, however, particle diameter of the conductive powder can be 0.1 to 10 μm, in another embodiment 1 to 5 μm, in another embodiment 1.5 to 3 μm. With such particle diameter, the conductive powder can be sintered well. For example, large particles can be sintered more slowly than small particles. Furthermore, it can be also necessary that the particle diameter can be appropriate for a method used to apply the conductive paste onto a semiconductor substrate, for example, screen printing. In an embodiment, it is possible to mix two or more types of conductive powder of different diameters.

The particle diameter (d50) is obtained by measuring the distribution of the particle diameters by using a laser diffraction scattering method and can be defined as D50. Microtrac model X-100 is an example of the commercially-available devices.

In an embodiment, the conductive powder is of ordinary high purity (99%). However, depending on the electrical requirements of the electrode pattern, less pure silver can also be used.

There are no special restrictions on the content of the conductive powder, however, in an embodiment, the conductive powder is 40 weight percent (wt %) or more, in another embodiment 55 wt % or more, in another embodiment 70 wt % or more based on the total weight of the conductive paste, in view of conductivity. For the maximum content, in an embodiment, the conductive powder can be 95 wt % or less, in another embodiment, 92 wt % or less, in another embodiment, 90 wt % or less based on the total weight of the conductive paste, in view of the powder's dispersity.

(ii) Glass Frit

A conductive paste contains a glass frit as an inorganic binder. When firing a conductive paste, a glass frit melts to promote sintering the conductive powder, and adhere to a substrate.

In an embodiment, softening point of a glass frit can be 390 to 600° C., in another embodiment 400 to 550° C., in another embodiment, 410 to 460° C. When the softening point is in the range, glass frit could melt properly to obtain the effects mentioned above. Here, the "softening point" is the softening point obtained by the fiber elongation method of ASTM C338-57.

The chemical composition of a glass frit here is not limited. Any glass frit suitable for use in electrically conducting pastes for electronic materials is acceptable. For example, a lead borosilicate glass and so on can be used. Lead silicate and lead borosilicate glasses can be excellent from a viewpoint of both softening point and glass fusion characteristics. In addition, zinc borosilicate or lead-free glasses can be also used.

In an embodiment, a glass frit can be 1 to 10 wt %, in another embodiment 2 to 8 wt %, in another embodiment 3 to 7 wt % based on the total weight of the conductive paste. With such amount of glass frit, sintering a conductive powder and adhesion between an electrode and a substrate can be sufficient.

(iii) Organic Polymer

An organic polymer is a macromolecule composed of at least two structural units of a monomer.

Any organic polymer can be used, however, in an embodiment, organic polymer can be epoxy resin, polyester resin, ethylene-vinyl acetate copolymer, or cellulose from a view point of good solvent solubility. In another embodiment, organic polymer can be polyvinyl chloride acetate copolymer, phenol resin, acrylic resin, ethyl cellulose or nitrocellulose. In another embodiment, organic polymer can be ethyl cellulose.

In an embodiment, organic polymer can be 0.1 to 2.0 wt %, in another embodiment, 0.15 to 1.5 wt %, in another embodiment, 0.2 to 0.8 wt % based on the total weight of the conductive paste. With such amount of organic polymer, conductive powder and glass frit could sufficiently disperse.

The organic polymer can be burned off during the firing step so that the electrode ideally contains no organic polymer residue. However, actually, a certain amount of residue can be allowable as long as does not degrade the electrical property of the electrode.

(iv) Organic Solvent

An organic solvent comprises at least 1-phenoxy-2-propanol.

Content of 1-phenoxy-2-propanol in the organic solvent is 30 to 85 wt % based on the weight of the organic solvent. In another embodiment, 1-phenoxy-2-propanol can be 40 to 80 wt %, in another embodiment 55 to 70 wt %, in another embodiment 60 to 70 wt %, based on the weight of the organic solvent. With such content, a conductive paste can be well kept from both drying and spreading as shown in Example below.

The other organic solvent to be mixed with 1-phenoxy-2-propanol can be a dibasic ester selected from the group consisting of dimethyl adipate, dimethyl glutarate, dimethyl succinate and a mixture thereof.

In an embodiment, a dibasic ester can be 70 wt % or less, in another embodiment, 60 wt % or less based on the weight of the organic solvent. In another embodiment, a dibasic ester can be 10 wt % or more, in another embodiment 30 wt % or more, in another embodiment 50 wt % or more, based on the weight of the organic solvent. By adding such amount of the dibasic ester which is highly-volatile, a desired pattern can be formed with a conductive paste when being applied onto a substrate.

In an embodiment, dimethyl adipate in the dibasic ester can be 75 to 95 wt %, in another embodiment 78 to 94 wt %, in another embodiment 80 to 93 wt % based on the total weight of the dibasic ester.

In an embodiment, dimethyl glutarate in the dibasic ester can be 3 to 23 wt %, in another embodiment 4 to 18 wt %, in another embodiment 4 to 16 wt % based on the total weight of the dibasic ester.

In an embodiment, dimethyl succinate in the dibasic ester can be 0.01 to 2 wt %, in another embodiment 0.05 to 1.8 wt %, in another embodiment 0.1 to 1 wt % based on the total weight of the dibasic ester.

In another embodiment, the dibasic ester can be a mixture of dimethyl adipate, dimethyl glutarate and dimethyl succinate.

In an embodiment, an organic solvent can be 1.0 to 15.0 wt %, in another embodiment, 3.0 to 13.0 wt %, in another embodiment, 5 to 10.0 wt %, based on the total weight of the conductive paste. With such amount of organic solvent, a conductive paste could obtain sufficient viscosity for printability.

(v) Additives

Thickener, stabilizer, viscosity modifier or surfactant as additives can be added to a conductive paste. Other common additives such as a dispersant, viscosity-adjusting agent, and so on can also be added. The amount of the additive depends on the desired characteristics of the resulting electrically conducting paste and can be chosen by people in the industry. The additives can also be added in multiple types.

EXAMPLES

The present invention is illustrated by, but is not limited to, the following examples.

(Preparation of Conductive Paste)

The conductive paste was produced using the following materials. The weight percent (wt %) herein means weight percent based on the total weight of the conductive paste.

Conductive powder: 84 wt % of spherical silver powder. The particle diameter (D50) was 2 μm.

Glass frit: 5.0 wt % of glass frit with the softening point of 430° C.

Organic polymer: 0.4 wt % of ethyl cellulose

Organic solvent: organic solvents were used as shown in Table 1. Content of the solvent was 7.7 wt %.

Additive: 2.9 wt % of an additive of a stabilizer, a viscosity modifier and a surfactant.

The conductive paste was prepared with the following procedure. The organic resin and solvent were mixed in a mixing can for 2 hours at 80° C. The Ag powder and the glass frit were added to the mixture of the organic resin and solvent and mixed for another 15 minutes to form a conductive paste. When well mixed, the conductive paste was repeatedly passed through a 3-roll mill for at progressively increasing pressures from 0 to 400 psi. The degree of dispersion was measured by fineness of grind (FOG). A typical FOG value was adjusted to 20/10 or less. Viscosity of the conductive paste was 250 Pa·s as measured by brookfield HBT viscometer.

The conductive paste obtained above was screen printed onto a SiN$_x$ layer formed on a silicon semiconductor substrate (38 mm×38 mm) through a screen mask with line patterns of 60 μm width and 36 mm length and 20 μm thickness.

The printed conductive paste was dried at 150° C. 5 min.

The dried conductive paste was fired in an IR heating type of a belt furnace (CF-7210, Despatch industry) at peak temperature setting with 905° C. Firing time from furnace entrance to exit was 78 seconds. The belt speed of the furnace was 550 cpm. The fired conductive paste cooled down to be an electrode.

Aspect ratio of the electrode was calculated with average height/average width of the electrode. The average height was a mean value of measured heights from the surface of the substrate and the top surface of the electrode at ten places with intervals of 70 μm on the electrode. The average width was a mean value of measured widths at 1200 points with intervals of about 0.5 μm on the electrode upper surface. The electrode height and width were measured with a confocal laser scanning microscopy, Model OPTELICS C130 from Lasertec corporation.

Apart from the aspect ratio measurement, drying level of the conductive paste was observed as follows.

Figure 2:
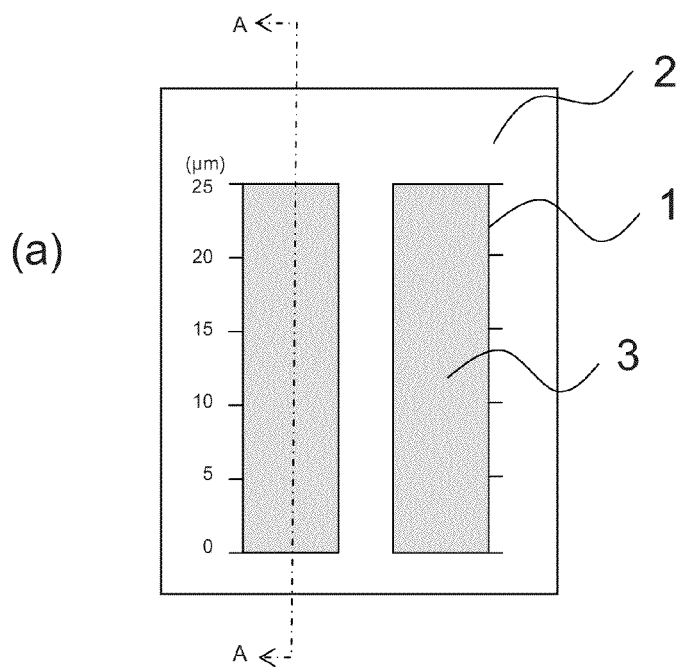
FIG. 2 (*a*) is a drawing for explaining an apparatus for measuring drying level and FIG. 2 (*b*) is A-A cross section drawing of the apparatus.
Figure 2:
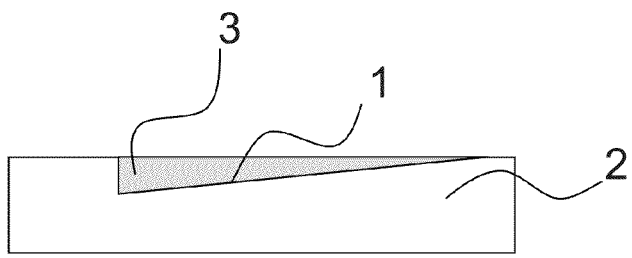

Grooves, 1, in a stainless block, 2, were filled with the conductive paste, 3, with a scraper (not shown) as shown FIG. 2(a). The groove dimensions were 25 mm wide, 160 mm long and forming a sloop as 0 to 25 μm depth. The stainless block dimensions were 240 mm long, 90 mm wide, 20 mm thick. The dried depth of the conductive paste was left for 180 minutes at room temperature of 25° C. and visually observed its color. As the conductive paste dried, the color changed from dark gray to light gray and a boarder between these colors gradually moved up from the depth zero toward depth 25 μm. The drying speed was measured by observing dried depth to which the center point of the boarder line reached.

(Results)

Conductive paste 1 and 5 reached to the dried depth lower than 6 μm, which showed these paste dried preferably slowly. Conductive paste 1 and 2 obtained the aspect ratios larger than 0.26, which were sufficiently high. From these results, conductive paste 1 containing 1-phenoxy-2-propanol could keep from drying sufficiently, and it could also keep from spreading on the substrate after screen printing, consequently form an electrode with high aspect ratio.

TABLE 1

| Paste No. | Solvent (CAS No.) | Dried depth (μm) | Aspect ratio (height/width) |
|---|---|---|---|
| 1 | 1-phenoxy-2-propanol (CAS No. 770-35-4) | 5.5 | 0.27 |
| 2 | Dibasic ester* | 9 | 0.29 |
| 3 | Texanol (CAS No. 25265-77-4) | 7 | 0.25 |
| 4 | Bis(2-butoxyethyl) ether (CAS No. 112-73-2) | 7 | 0.22 |
| 5 | 2-(2-butoxyethoxy)ethyl acetate (CAS No. 124-17-4) | 5 | 0.25 |
| 6 | Terpineol (CAS No. 138-87-4) | 8 | 0.25 |

*Dibasic ester was a mixture of 89% of dimethyl adipate, 10 wt % of dimethyl Glutarate and 0.2 wt % of dimethyl succinate (DBE-3 from INVISTA Inc.).

In turn, an effect of 1-phenoxy-2-propanol content was examined. Solar cell electrodes were prepared in the same manner as above except that the solvent in a conductive paste was a mixture of a dibasic ester and 1-phenoxy-2-propanol. The percentage by weight of the dibasic ester and 1-phenoxy-2-propanol was 100 wt % 10 wt %, 65 wt % 135 wt %, 35 wt %/65 wt %, 0 wt % 1100 wt % respectively.

The screen mask used at screen printing had a line pattern consisted of a bus bar with 2.0 mm width, 36 mm length and finger lines at one side of the bus bar with 0.1 μm width and 35 mm length with 2.15 mm of interval distance between the finger lines.

An aluminum paste was further screen printed over the other side of the silicon substrate and dried.

The solar cell was tested for fill factor (FF) with a commercial IV tester (NCT-150AA, NPC Corporation). The Xe Arc lamp in the IV tester simulated the sunlight with a known intensity and spectrum to radiate with air mass value of 1.5 on the front surface of the solar cell. The tester used "four-point probe method" to measure current (I) and voltage (V) at approximately 400 load resistance settings to determine the cell's I-V curve. The bus bar was connected to the multiple probes of the IV tester and electrical signals were transmitted through the probes to the computer for calculating FF.
(Result)

Figure 3:
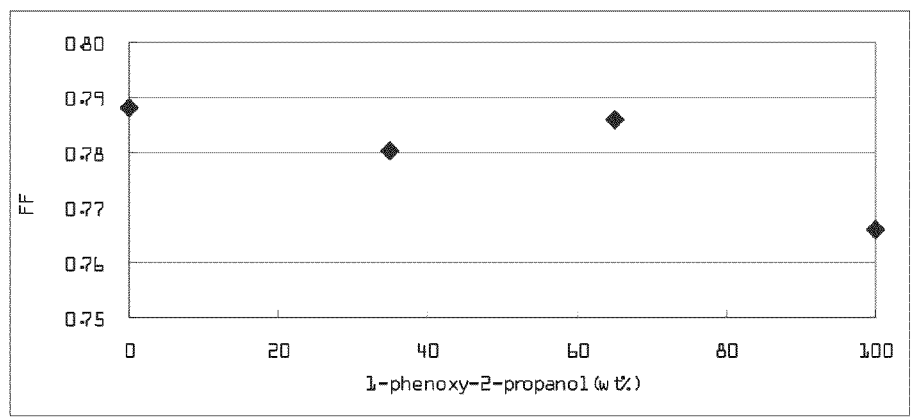
FIG. 3 is a figure showing an effect of 1-phenoxy-2-propanol content on fill factor of a solar cell in case that an electrode is formed as a solar cell electrode.

According to FIG. 3, FF was low when the conductive paste contained 100 wt % of 1-phenoxy-2-propanol. A solar cell with an electrode formed with a conductive paste comprising 1-phenoxy-2-propanol not more than 70 wt % could obtain sufficient electrical property.

What is claimed is:

1. A method of manufacturing a solar cell electrode comprising steps of: applying onto a semiconductor substrate a conductive paste comprising (i) a conductive powder, (ii) a glass frit, (iii) an organic polymer and (iv) an organic solvent comprising 30 to 85 weight percent (wt %) of 1-phenoxy-2-propanol based on the weight of the organic solvent; and firing the conductive paste.

2. The method of manufacturing a solar cell electrode of claim 1, wherein the organic solvent comprises, based on the weight of the organic solvent, 10 to 70 wt % of a dibasic ester selected from the group consisting of dimethyl adipate, dimethyl glutarate, dimethyl succinate and a mixture thereof.

3. The method of manufacturing a solar cell electrode of claim 2, wherein the dimethyl adipate is 75 to 95 wt % based on the total weight of the dibasic ester.

4. The method of manufacturing a solar cell electrode of claim 1, wherein the organic solvent is 1.0 to 15.0 wt % based on the total weight of the conductive paste.

5. The method of manufacturing a solar cell electrode of claim 1, wherein firing peak temperature is in a range of 450° C. to 1000° C. and firing total time from an entrance to an exit of a furnace is from 30 seconds to 5 minutes.

6. The method of manufacturing a solar cell electrode of claim 1, wherein the conductive paste is applied onto a substrate by screen printing.

* * * * *